United States Patent [19]

Green et al.

[11] Patent Number: 5,081,049
[45] Date of Patent: Jan. 14, 1992

[54] SCULPTED SOLAR CELL SURFACES

[75] Inventors: Martin A. Green, Waverley; Stuart R. Wenham, Illawong; Narayanan Srinivasamohan, Anzac Parade Kensington, all of Australia

[73] Assignee: Unisearch Limited, Kensington, Australia

[21] Appl. No.: 381,494

[22] Filed: Jul. 18, 1989

[30] Foreign Application Priority Data

Jul. 18, 1988 [AU] Australia .................... PI9362

[51] Int. Cl.⁵ .................................. H01L 31/18
[52] U.S. Cl. ........................ 437/2; 136/249; 136/255; 136/256; 156/644; 156/662; 357/30
[58] Field of Search .......... 136/249 MS, 255, 256; 437/2-5, 51, 205, 203, 225; 156/644, 662; 219/121.71, 121.72; 357/30 J, 30 L, 20

[56] References Cited

U.S. PATENT DOCUMENTS

| | | | |
|---|---|---|---|
| 4,135,950 | 1/1979 | Rittner | 136/255 |
| 4,137,123 | 1/1979 | Bailey et al. | 156/647 |
| 4,184,894 | 1/1980 | Lindmayer et al. | 136/249 MS |
| 4,227,942 | 10/1980 | Hall | 136/255 |
| 4,252,865 | 2/1981 | Gilbert et al. | 428/611 |
| 4,295,002 | 10/1981 | Chappell et al. | 136/244 |
| 4,352,948 | 10/1982 | Kaplow et al. | 136/249 |
| 4,360,701 | 11/1982 | Evans, Jr. | 136/259 |
| 4,379,944 | 4/1983 | Borden et al. | 136/259 |
| 4,409,423 | 10/1983 | Holt | 136/255 |
| 4,420,650 | 12/1983 | Wise et al. | 136/255 |
| 4,427,839 | 1/1984 | Hall | 136/255 |
| 4,626,613 | 12/1986 | Wenham et al. | 136/255 |
| 4,726,850 | 2/1988 | Wenham et al. | 136/256 |

FOREIGN PATENT DOCUMENTS

| | | | |
|---|---|---|---|
| 25477/77 | 5/1977 | Australia | 136/249 |
| 36332/78 | 5/1978 | Australia | 156/628 |
| 3709178 | 6/1978 | Australia | 136/256 |
| 23243/84 | 7/1984 | Australia | 136/258 |
| 36664/84 | 12/1984 | Australia | 136/255 |
| 52-57792 | 12/1977 | Japan | 136/256 |

OTHER PUBLICATIONS

R. J. Roedel et al., *Solar Cells*, vol. 11, pp. 221-239 (1984).
N. M. Bordina et al., *Geliotekhnika*, vol. 18, No. 3, pp. 6-11 (1982).

*Primary Examiner*—Aaron Weisstuch
*Attorney, Agent, or Firm*—Christie, Parker & Hale

[57] ABSTRACT

The present invention relates to the shaping of solar cell substrate surfaces in order to provide advantageous light-catching and interaction properties.

Previous solar cell substrates have suffered from a relatively high percentage loss of light due to reflection from the substrate surface, as well as the disadvantage that light passing into the substrate may not be absorbed in regions of high collection probability, close to the semiconductor junctions.

By specifically shaping the surface of the substrate to produce predetermined surface structures the above disadvantages can be minimized. Previous texturing of solar cell substrates has relied on the crystalline structure of the substrate to control the surface texture. The surface thus produced does not maximize the antireflection and absorption properties.

By using a laser scriber and following this with a chemical etch, we produce surface shapes which maximize the anti-reflection and absorption properties of the solar cell.

18 Claims, 7 Drawing Sheets

SCULPTED SOLAR CELL SURFACES

The present invention relates to methods of shaping the surfaces of substrates which are to be used to form solar cells, and to solar cell surfaces so shaped.

Solar cells having substantially flat surfaces suffer from a number of disadvantages. For example, substantial surface reflection tends to occur so that a large part of the incident light is never absorbed by the cell. Further, light that is absorbed tends to travel in a direction substantially perpendicular to the cell surface, deep into the cell and away from the regions of high collection probability near the p/n junctions, such that much of the light energy is not utilized to provide current.

Some attempt has been made to overcome these problems. For example, reference is made to the applicant's own Australian Patent No. 565214, entitled "Laser Grooved Solar Cell", where grooves are made in the surface of a solar cell substrate and dopant is then diffused into the surface to form a p/n junction which follows the contours of the grooved surface. Because the p/n junctions follow the grooves and therefore lie deeper in the substrate, light passing deep into the substrate may still pass near a junction and may therefore act to produce current. The grooved surface also provides some improvement in the reflection properties of the surface, as light incident on the groove may be reflected onto another wall of the groove rather than away from the solar cell altogether, so that there is a better change of more light energy being absorbed.

However, these prior art shaping techniques have depended on the crystal structure of the solar cell substrate (usually silicon) to govern the final surface shape. With silicon, chemical etches are available which quickly etch the silicon <100> planes but only slowly etch the <111> planes. Previous techniques have relied on revealing the <111> planes by chemical etching (although in AU 565214 a laser is used to provide the initial groove and an etch is then used to reveal the <111> planes, to give a "V" shaped grooved or inverted pyramid shaped holed surface structure, the sides of the "V" or pyramid being angled at the normal <111> plane angle of 55°.

We have found that better, more efficient, surface shapes of a solar cell can be produced irrespective of the use of the silicon <111> planes by "sculpting" the solar cell surfaces to give the desired shape. We have also found a number of highly advantageous and efficient surface shapes.

The present invention provides a method of processing a silicon solar cell substrate, comprising the steps of sculpting the solar cell surface by scribing the surface of the substrate to form a pattern of grooves and subsequently chemically etching the patterned surface to give a specifically desired cross-sectional shape to the grooves over substantially the entire surface, the sculpting being such that the cross-sectional shape of the grooves does not follow crystal planes of the silicon substrate, and the surface shape of the substrate is such as to substantially maximize anti-reflection properties and predominantly cause light transmitted into the silicon to be focussed or steered so as to cause it to be multiply totally internally reflected from the silicon surface prior to reaching the rear surface, and doping the front surface of said silicon substrate to form a p-n semiconductor junction therein.

The present invention further provides a method of processing a silicon solar cell substrate, comprising the steps of sculpting the solar cell surface by scribing the surface of the substrate to form a plurality of recesses and subsequently chemically etching the patterned surface to give a plurality of discreet upstanding structures of specifically desired shape over substantially the entire surface of the substrate, the shape of each of the structures being a predetermined shape whose form does not depend on crystal planes of the silicon substrate, the predetermined shape being such as to substantially maximize anti-reflection properties and predominantly cause light transmitted into the silicon to be focused or steered so as to cause it to be multiply totally internally reflected from the silicon surface prior to reaching the rear surface of the cell, and diffusing a dopant into the surface to form a p-n semiconductor junction.

Two major types of sculpted surface are envisaged in this invention. In the first, a series of grooves are created in the surface, the grooves being sculpted with a predetermined desirable cross section. In the second, the scriber is used to create a cross-hatched type pattern on the substrate surface, which is then etched to form a plurality of adjacent upstanding structures of predetermined shape.

The concept of "sculpting" the solar cell surface means that advantageous surface properties can be produced and maximised.

In particular, it can provide:
 (i) reduced surface reflection by ensuring that the majority of incident light is reflected at least three times prior to escaping the surface;
 (ii) regions of higher collection probability for generated charge carriers through the location of rectifying junctions in close proximity to where the majority of light passes and is absorbed;
 (iii) steering or focusing of the light into the regions of high collection probability by obliquely coupling it into the silicon;
 (iv) large increases in the effective diffusion length by incorporating light trapping in the vicinity of the top surface to repeatedly totally internally reflect the light through the regions of high collection probability.

A number of particularly advantageous surface shapes have been determined.

The present invention further provides a method of processing a semiconductor solar cell substrate comprising the steps of scribing the surface of the substrate to form a pattern of grooves which are angled with respect to the surface at an angle other than 90°, giving a plurality of adjacent "leaning" structures and diffusing a dopant into the surface to form a semiconductor junction, the "leaning" structures being arranged to cause multiple internal reflection of any light incident on the semiconductor substrate.

The present invention yet further provides a solar cell substrate comprising a semiconductor substrate having a sculptured surface shape, comprising a plurality of adjacent "V" cross-section shaped grooves or upstanding pyramid structures, the sides of the "V" or pyramid structure being at an angle of 60° or over with respect to the apex of the "V" or pyramid.

The present invention yet further provides a solar cell substrate comprising a semiconductor substrate having a sculptured surface shape, comprising a plurality of adjacent contoured grooves or upstanding finger-like structures, the sides of the grooves, holes or structure being contoured so that their slope is steeper towards the base of the grooves, holes or structures and gradually gets less steep towards the top of the grooves, holes or structures.

The present invention yet further provides a solar cell substrate comprising a semiconductor substrate having a sculptured surface shape, comprising a plurality of adjacent upstanding structures having inverted substantially triangular shaped cross-sections.

Preferably the inverted triangular shaped structures are separated from each other by substantially triangular cross-section grooves, opposite walls of the structures being doped with different polarity dopants, and the solar cell surface being metal plated to electrically connect one polarity area of one structure to a different polarity area of the adjacent structure, whereby to give a plurality of series connected solar cell devices on the same substrate.

The present invention yet further provides a solar cell substrate comprising a semiconductor substrate having a sculptured surface shape, comprising a plurality of adjacent leaning structures upstanding from the surface and separated by grooves running at an angle to the surface.

These above advantageous structures may be produced in accordance with the method of the present invention, using appropriate scribing and etching techniques.

Creating upstanding structures which are adjacent to each other and have walls sloping at 60° or over, and which are close enough to each other such that incident light is reflected at least three times before escaping the surface means that very little light is lost.

The present invention can be extremely advantageous when applied with:
 (i) polycrystalline substrates, mainly for reflection properties, since conventional forms of texture etching to expose the <111> silicon planes are not applicable;
 (ii) low quality low lifetime substrates, where effective diffusion length boosts provide marked improvement in efficiency;
 (iii) space cells, where improved radiation damage tolerance is provided by the machined surface;
 (iv) high efficiency cells in general, where reduced reflection, light trapping and effective diffusion length increases are all of primary importance.

Features and advantages of the present invention will become apparent from the following description of embodiments thereof, by way of example only, with reference to the accompanying drawings, in which.

The laser in conjunction with appropriate selective and non-selective etches has proven capable of sculpting the silicon surface to produce virtually any desired shapes or structures.

It is of particular interest to note that if textured silicon surfaces had pyramid faces at 60 degrees to the horizontal rather than 55 degrees, then all normal incident light would be reflected three times. This alone without any anti-reflection coating would reduce the surface reflection to about 4% for the solar spectrum, which in the presence of an appropriate thickness surface oxide layer would further reduce to less than 1%. Where practical it is therefore advantageous to have all laser and otherwise machined surfaces with slopes in excess of 60 degrees to the horizontal.

Figure 1:
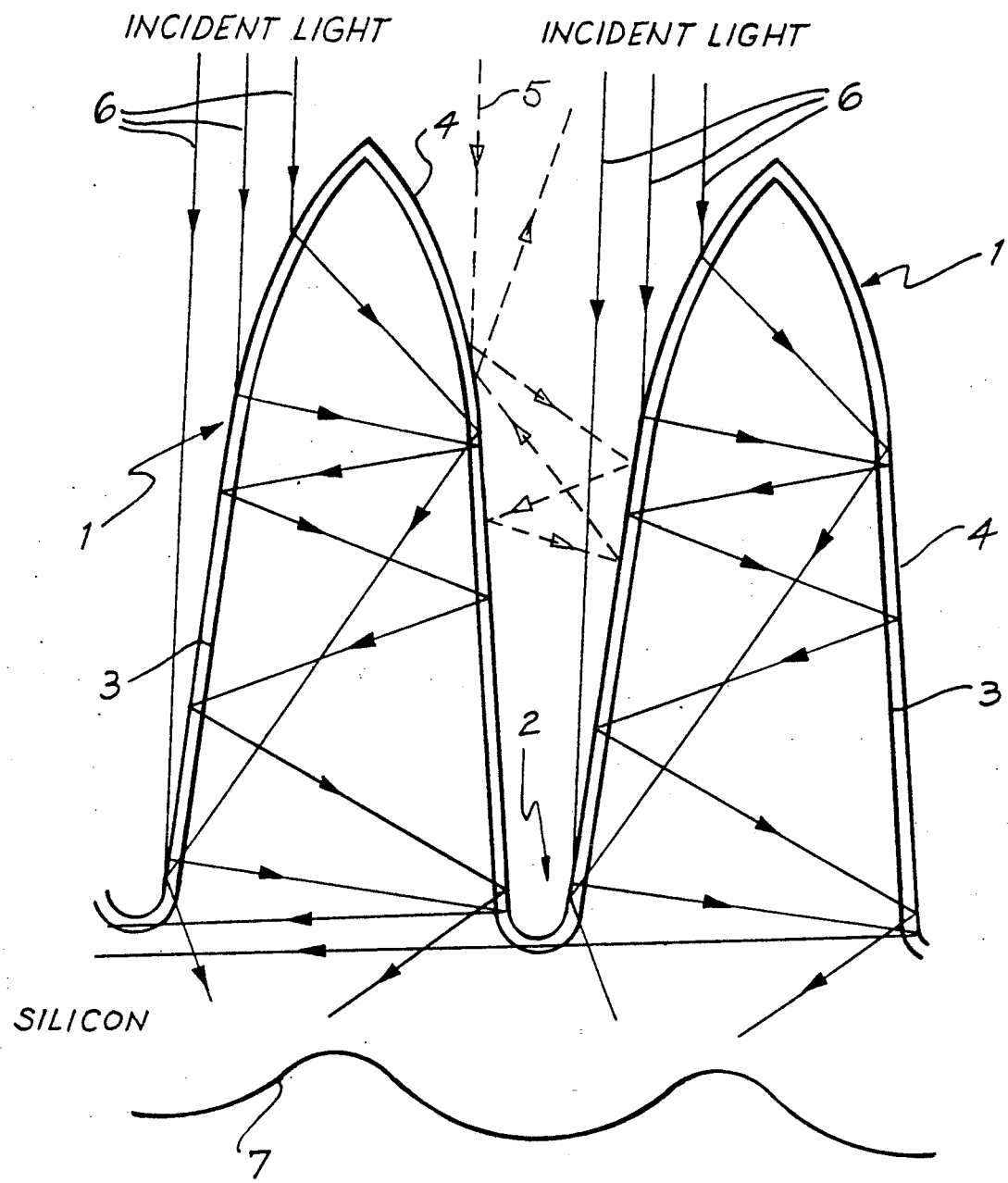
FIG. 1 shows a schematic cross-sectional view through a silicon solar cell substrate surface shaped in accordance with an embodiment of the present invention.

To provide an increase in the effective diffusion length, the aim is to steer the light into regions of high collection probability for the longest practical distance. A <100> silicon surface chemically textured to expose the <111> silicon planes, acts to increase the effective diffusion lengths by approximately 35% due to the oblique coupling of light into the substrate. These improvements in diffusion length however can be greatly enhanced in accordance with the present invention through deliberate shaping of the surface to couple or steer the light into the silicon at more desirable angles. Hence a far more attractive proposition than relying on the natural structures formed through exposure of the 111 planes, is to create structures with steeper faces such as in FIG. 1. FIG. 1 shows a cross-section through a silicon surface having upstanding structures 1 which may be walls of grooves 2 or adjacent finger-like structures surrounded by "moat" 2. Reference numeral 3 illustrates a semiconductor junction created by diffusing dopant into the sculpted substrate surface. The junction 3 follows the contours of the surface. Note that in the following drawings it should be assumed that semiconductor junctions which follow the surface contours are present, even though they are not actually shown in the drawings.

The steep faces 4 of the FIG. 1 structure, which are preferably 60° and over, act to greatly reduce surface reflection. Incident light will be reflected on this surface at least three times before escaping the surface, greatly reducing the amount of light which is lost to the solar cell. This is illustrated by broken line 5, which represents an incident light ray. This particular ray is reflected four times from the structures 1 before escaping the surface. Each time reflection occurs some of the light will be coupled into the surface of the solar cells. The more reflections that occur, the less light that is lost. The steeper faces not only provide for greatly reduced surface reflection, but couple the light into the silicon in a manner whereby multiple total internal reflections take place within the protruding structure before the light passes into the main bulk region as illustrated by light rays 6. Appropriate sizing of such structures relative to the minority carrier diffusion length of the bulk material results in extremely high collection probabilities for carriers generated within the protruding region due to the almost total enclosure by the diffused layers 3. Line 7 shows the approximate active volume boundary for this structure. In addition the multiple total internal reflections can cause virtually all light to be absorbed within these regions of high collection probability hence potentially giving high Hsc values, even for substrates with quite modest diffusion lengths. For such structures or grooves, we have found it advantageous that the groove walls are spaced some 1½ to 1¼ times the diffusion length of the particular substrate material, and similarly for the spacing between the adjacent upstanding structures.

Figure 2:
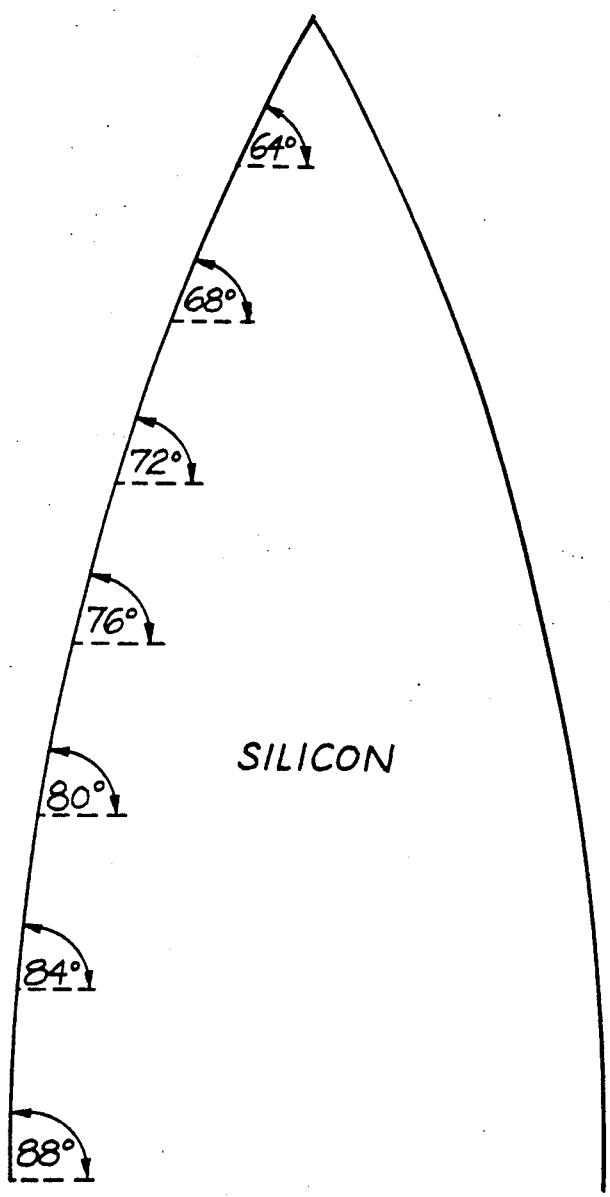
FIG. 2 shows a computer model of a cross-sectional shape having advantageous properties for the surface of a silicon cell substrate.

A computer model was established to simulate the performance of various structures. A piecewise linear approximation of the surface shape of a structure 1 was used such as that shown in FIG. 2. The computer simulation for this particular structure predicted an effective diffusion length increase by a factor of four when the dimensions of the protruding structure were appropriately matched to the true bulk minority carrier diffusion lengths.

The predicted results through computer modelling hold particular interest for future generations of solar grade substrates produced from feedstock of lower quality than the currently used semi-conductor grade. Such substrates could realistically be expected to have diffusion lengths in the vicinity of 30-40 microns, hence making machined surfaces with their accompanying diffusion length boosts and reduced reflection particularly attractive.

Even for high lifetime substrates, micro-machining of the surface can be used as a means for coupling light into the substrate in a path direction almost parallel to the cell surfaces. The benefits of this, although not as marked as for low lifetime substrates, are still quite significant.

Such techniques are also capable of providing improved resistance to radiation damage for a cell's electrical output. The dimensions of the relevant structure are designed on the basis of matching them to the expected end of life diffusion length for the substrate. In this way, the short circuit current density for the solar cell would have a lower than optimal value during the early years of its life, but with relatively small reductions subsequently as the substrate diffusion lengths fall.

Machining of the silicon surface in accordance with the present invention is conveniently accomplished through the use of a laser scriber in conjunction with appropriate etching solutions. The laser provides the sites for nucleation of etching with the solution type, concentration, temperature and etching duration being the primary variables in determining the final formation.

Figure 3:
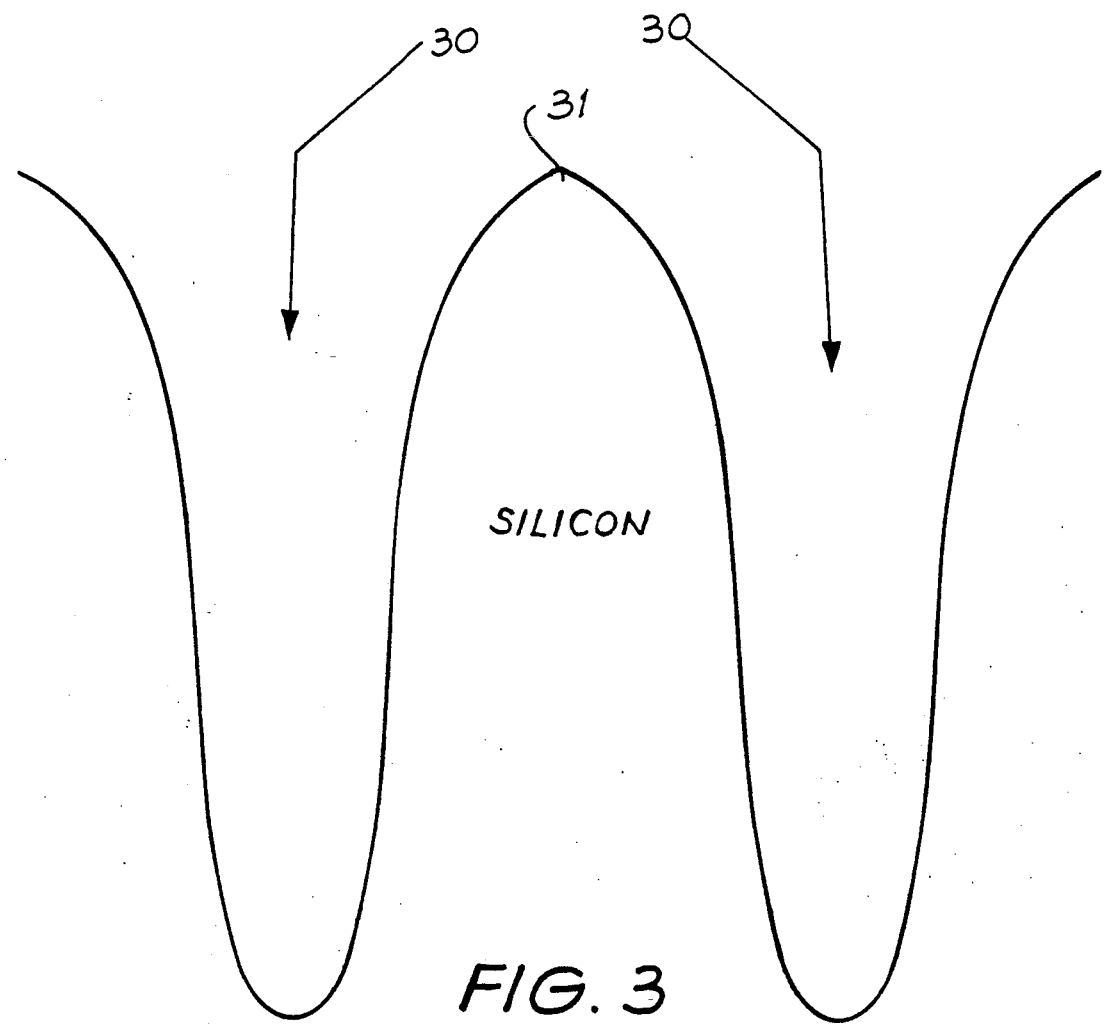
FIG. 3 shows a further schematic cross-sectional view through a silicon solar cell substrate surface shaped in accordance with an embodiment of the present invention.

Without relying on the silicon <111> planes for shape determination, the etching conditions can be varied to form virtually any shape. For instance, the use of low concentration NaOH (5%) results in depletion towards the bases of the grooves, hence leading to reduced reaction rates in these regions and the formation of "V" shaped structures. At the other extreme, the use of high concentration NaOH (20%) at moderate temperatures (60.80 degrees celcius) produces uniform etch rates as a function of depth within the laser groove thus resulting in "U" shaped formations. Variations between these extremes enables the production of virtually any desired slope on groove walls. In addition, high temperatures coupled with a high NaOH concentration can be used to greatly accelerate the reaction in the surface regions but not deep in the groove where the rapid evolution of gases retards replenishment of the etching solution. FIG. 3 shows the typical shape formed from such etching conditions where a distinct curvature of the groove walls can be created. It should be noted however that although this shape bears considerable resemblance to the structure modelled in FIG. 2, a relatively flat base region to the groove exists. Light striking this region will not receive the benefits of oblique coupling. However, due to the facts that such grooves are typically 150 microns deep and the width of the flat region is only about 10 microns, then unless light is within 4 degrees of normal incidence, none will strike the flat region. A range of 30-200 microns is usual with substrates of usual carrier diffusion length, for the depth of grooves.

With all such structures, the location, periodicity and depth of structures are determined by the laser scriber. Once a certain depth groove is drilled by the laser, subsequent etching has virtually no effect on the depth or location of that groove base. The depth of a groove may however effectively be reduced by appropriate etching away of the silicon surface to bring it into close proximity with the base.

The formation of some sculptured surface shapes benefit greatly from the use of an isotropic etch such as the acid etch comprised of nitric acid and hydrofluoric acid. In particular, with polycrystalline structures the isotropic properties are useful for providing uniformity across a sculptured surface. Unfortunately, such etches are not as effective at removing the silicon redeposited in the grooves during laser scribing and hence must be used in conjunction with an etch such as NaOH.

With the described techniques for machining the solar cell surfaces, structures of virtrually any shape can be formed.

There are three basic ways in which the surface can be machined in accordance with the present invention. A series of parallel grooves may be formed in the surface of the substrate, the profile of the grooves subsequently being shaped by chemical etch, to give cross-sectional shaped grooves such as in FIGS. 1 (ref numeral 2), 3 (ref numeral 30), and 5 (ref numeral 60). Alternatively, the surface could be initially scribed in a cross hatched pattern, the cross hatches subsequently being etched to leave a plurality of adjacent upstanding three dimensional structures, as with cross-sections such as shown in FIGS. 1 (ref numeral 1), 3 (ref numeral 31), and 5 (ref numeral 61).

Figure 4:
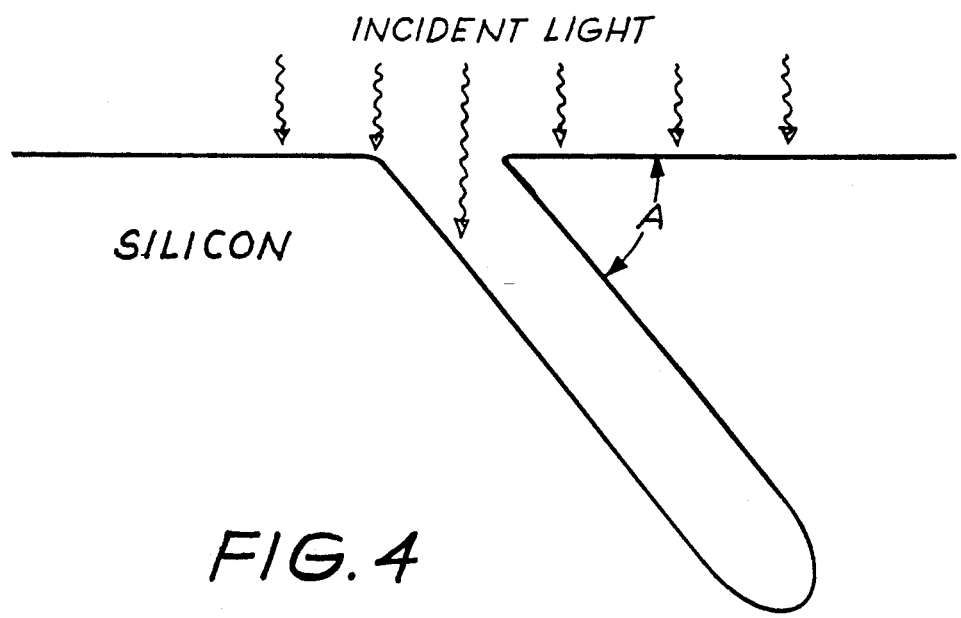
FIG. 4 shows a schematic cross-sectional view through a silicon solar cell substrate surface, illustrating a groove in the surface which has been cut at an angle.

A further variation in the formation techniques of structures involves the use of the laser scriber (or equivalent) to scribe grooves at an angle to the normal of the top surface (see FIG. 4).

Figure 5:
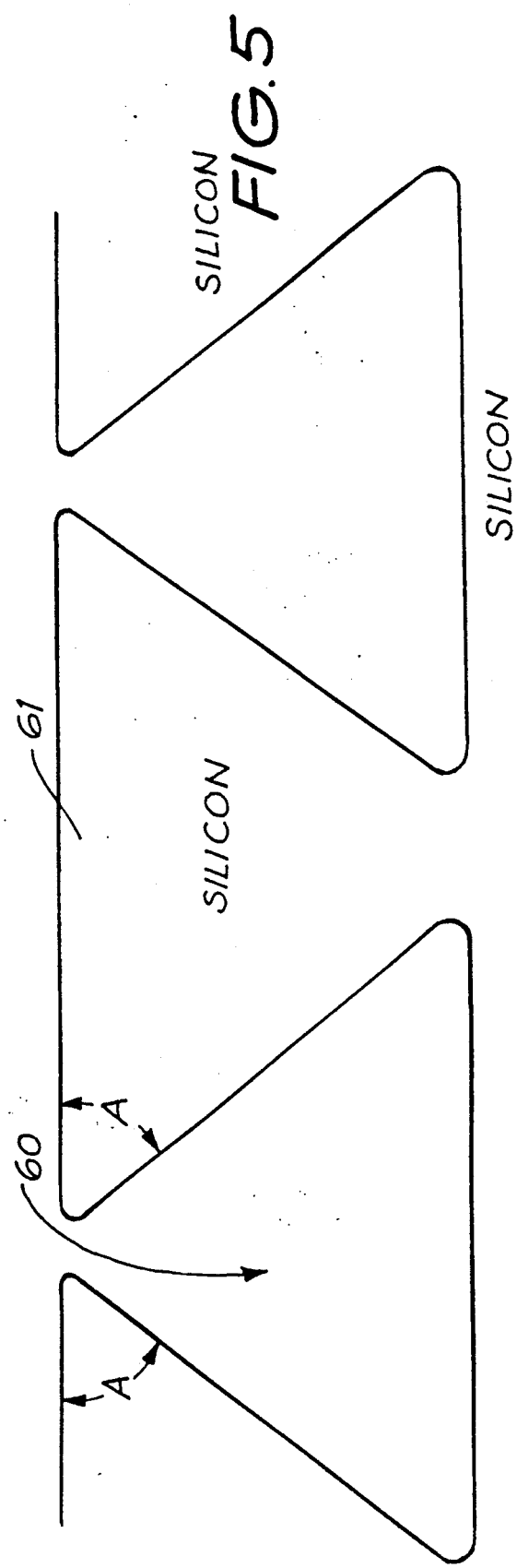
FIG. 5 shows a schematic cross-sectional view through a silicon solar cell substrate surface shaped in accordance with an embodiment of the present invention.
Figure 6:
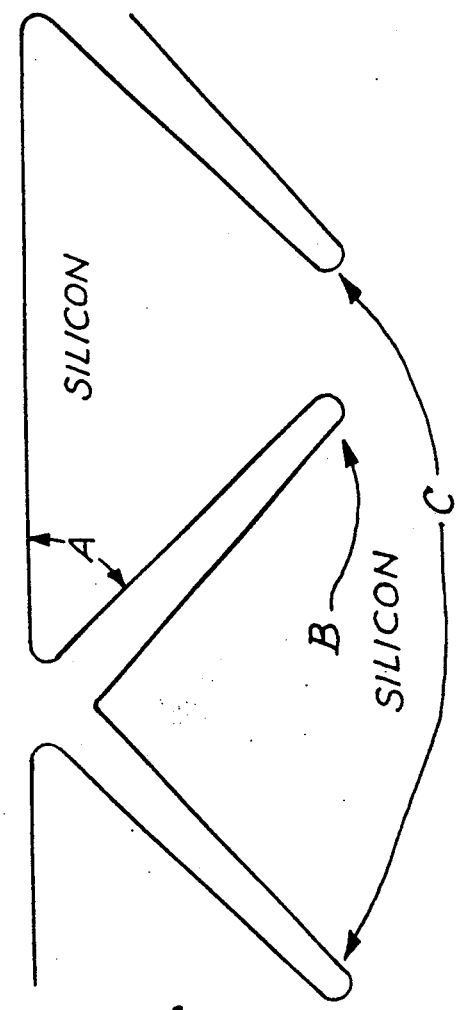
FIG. 6 shows a schematic cross-sectional view through a silicon solar cell substrate surface to illustrate a step in the manufacture of the surface of FIG. 5.
Figure 8:
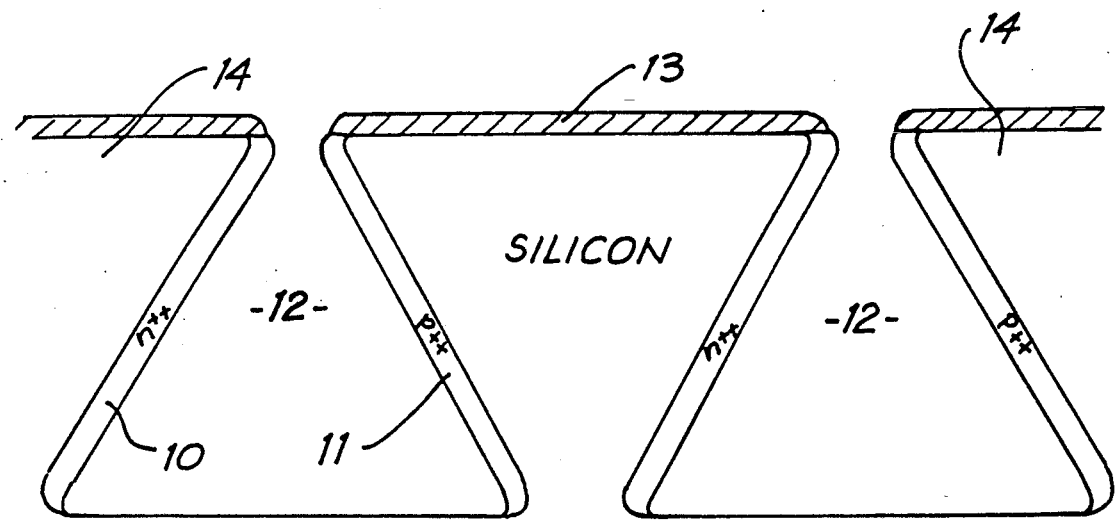
FIGS. 8 and 9 (including FIGS. 9a and 9b) show the surface of FIG. 5 in more detail.
Figure 9A:
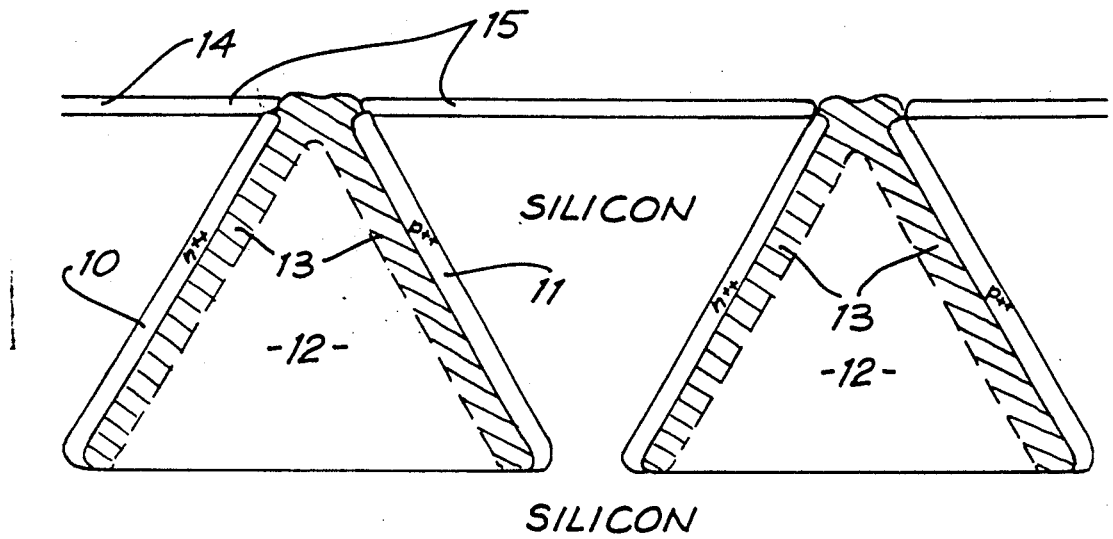
Figure 9B:
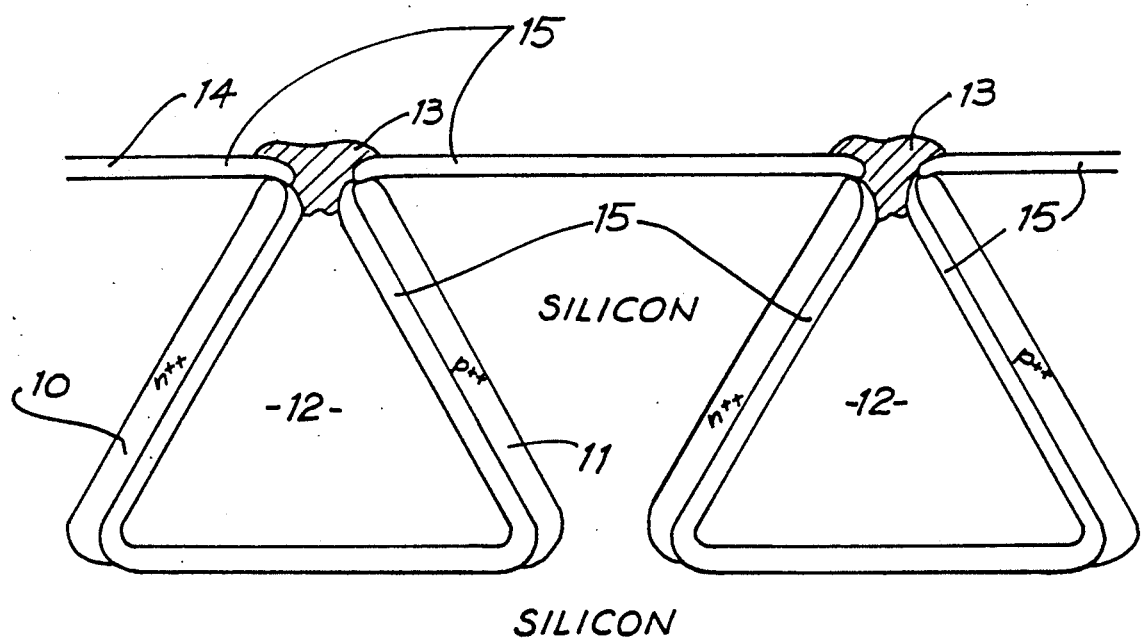

The use of angular scribes makes it feasible to form structures such as in FIG. 5 with relative ease. One possible sequence for formation is depicted in FIG. 6. By separately scribing the set of grooves labelled "B" from the set of grooves "C", it is feasible to have different polarity diffusino types in the respective groove wall regions. Hence, structures 14 typified by FIG. 8 wherein opposed walls 10, 11 of the triangular shaped grooves 12 have opposite polarity diffusion types can be formed making practical, on high resistivity substrates, the series connection of devices on the same substrate via appropriate metallization. Examples of such interconnection techniques are shown in FIGS. 9a and 9b. The same reference numerals are used to represent the same components as in FIG. 8. In FIG. 9a, the n10 and p11 type regions on adjacent devices 14 are plated with metal plate 13, gradually filling the hollow region between devices with plated metal until each n-type region 10 is electrically interconnected to the p-type 11 region of the adjacent device 14. If it is necessary to prevent large areas of metal coverage, all surfaces can be protected by a thermally grown oxide 15. An appropriate chemical etch can then be used to prematurely attack the $SiO_2$ layer 15 at the points (corners), hence exposing very small regions of n-type 10 and p-type 11 silicon. Subsequent plating 13, such as with electroless nickel followed by electroless copper, leads again to the series interconnection of the devices on the same substrate, with the cross-section indicated by FIG. 9b.

Figure 7:
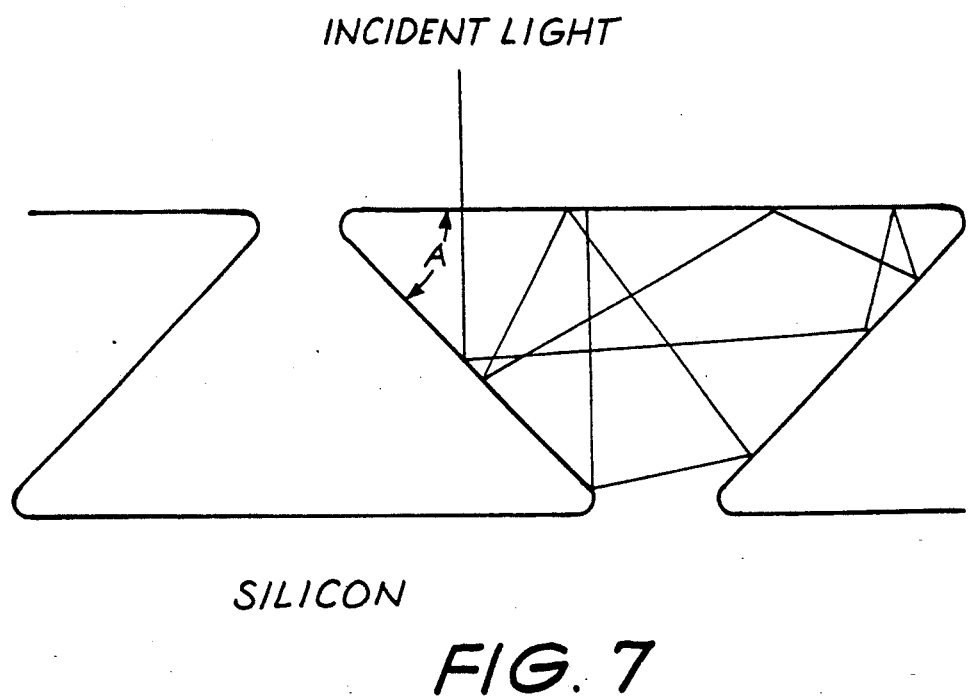
FIG. 7 shows a surface according to FIG. 5, illustrating the path light may take which is incident on that surface.

FIG. 7 shows a cross sectional view of upstanding structure 61 of FIG. 5 illustrating the path light may take which is incident on the structure, showing that there are a number of internal, reflections increasing absorbance efficiency of the solar cell.

Figure 10:
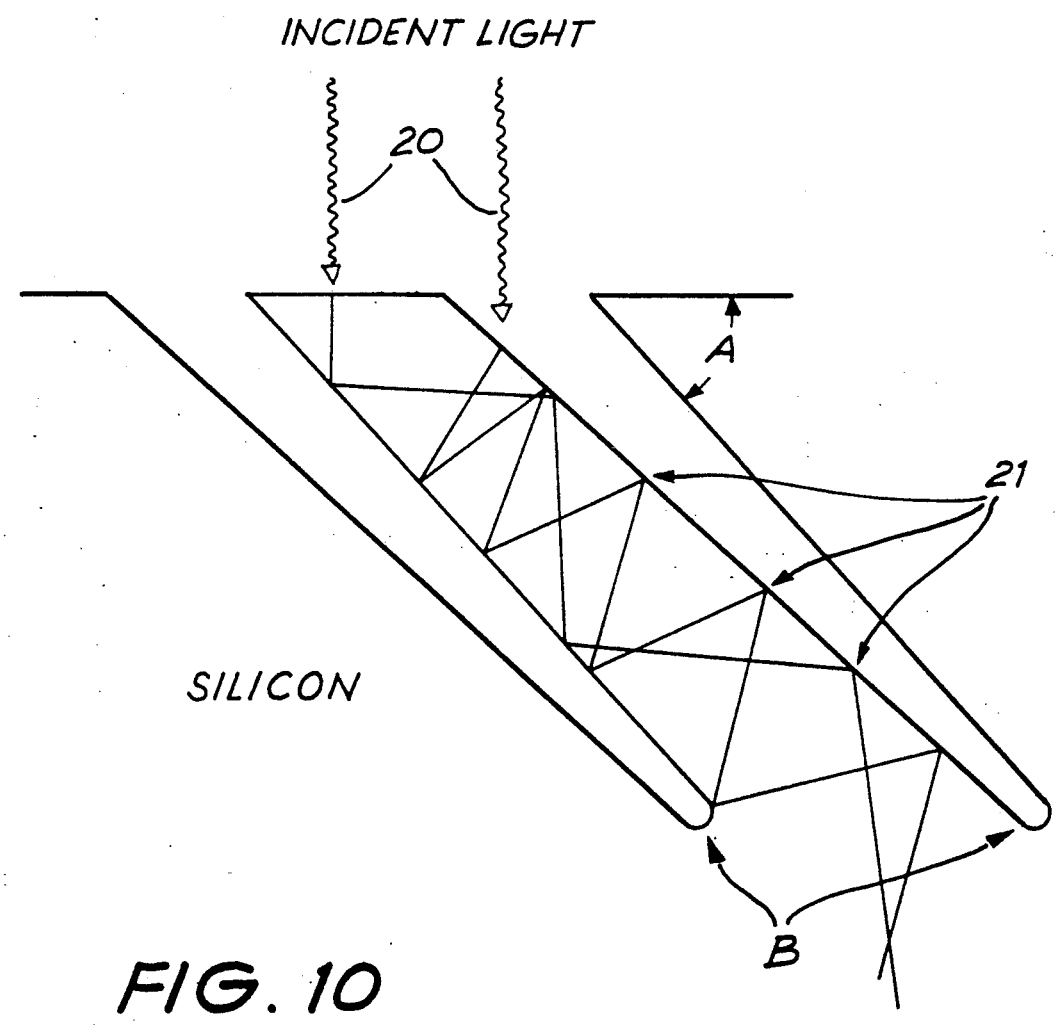
FIG. 10 shows a cross-sectional schematic diagram through a silicon solar cell substrate surface shaped in accordance with a further embodiment of the present invention.

In addition to the potential for interconnectins cells on the same substrate, structures such as FIG. 10 with the appropriate selection of Angles A and A' by angular scribes, can provide exceptionally long path lengths for light through the silicon. This results as the light 20 undergoes multiple total internal reflections 21 in the protruding regions. Furthermore, the active volume for the substrate can be greatly reduced, very high collection probabilities for all generated carriers can be achieved, and metal shading losses can be kept to a minimum.

It will be appreciated that variations in the scribing angles and spacing between scribes, in conjunction with appropriate selective or non-selective etches, can produce structures of virtually any desired shape and size.

We claims.

1. A method of processing a silicon solar cell substrate, comprising the steps of sculpting the solar cell light receiving surface by scribing the light receiving surface of the substrate to form therein a pattern of grooves and subsequently chemically etching the patterned surface to give a specifically desired cross-sectional shape to the grooves over substantially the entire surface, the sculpting being such that the cross-sectional shape of the grooves does not follow crystal planes of the silicon substrate, and the surface shape of the substrate is such as to substantially maximize anti-reflection properties and predominantly cause light transmitted into the silicon to be focussed or steered so as to cause it to be multiply totally internally reflected from the silicon light receiving surfaca prior to reaching the opposite surface, and doping the front surface of said silicon substrate to form a p-n semiconductor junction therein.

2. The method of claim 1, wherein the processing is such as to give a spacing between adjacent grooves which is comparable with the minority carrier diffusion length of the substrate material to miximize the path length of light within the silicon and within a diffusion length of the p-n junction formed in close proximity to the sculpted surface, thereby maximizing carrier collection probabilities.

3. The method of claim 2, wherein the minority carrier diffusion length is the expected end of life diffusion length, thereby maximizing carrier collection probabilities over the lifetime of the solar cell.

4. The method of claim 1, wherein the chemical etch conditions are chosem to give depletion at the bases of the grooves so as to produce a "V" shaped cross-section groove structure such that the sides of the "V" shaped grooves are at an angle of at least 60° with respect to the original surface of the substrate.

5. The method of claim 4, wherein the chemical etchant is NaOH of a concentration of not greater than 5%.

6. The method of claim 1, wherein the chemical etch conditions are chosen so as to accelerate the etching reaction proximate to the front surface of the surface of the substrate as compared to that relatively deeper in the grooves, thereby providing a contour to the groove walls, the contour being such that the angle of the walls with respect to the original flat surface of the substrate progressively increases toward the base of the grooves.

7. The method of claim 6, wherein the chemical etch conditions are chosen so that the contoured walls always have angles of at least 60° with respect to the original flat surface of the substrate.

8. The method of claim 1, wherein the step of scribing is performed with a laser directed at an angle other than 90° to the front surface of the substrate to form grooves which are angled with respect to the surface.

9. The method of claim 8 wherein adjacent grooves extending at opposed angles to each other are formed and wherein the substrate between the opposed grooves is removed by chemical etching to provide a plurality of adjacent grooves of substantially wedge shaped cross-sections.

10. The method of claim 9, wherein, during the doping step, different polarity dopants are used for each groove in an opposed pair of grooves so that when the substrate between the grooves is removed, opposite walls of the wedge-shaped groove are of different polarity, and further comprising metal plating the substrate to electrically connect one polarity area of one groove to a different polarity area of an adjacent groove, thereby producing a series connection of solar cell devices in the same substrate.

11. The method of claim 1, wherein parallel grooves are angled at the same angle into the substrate, giving a plurality of adjacent "leaning" structures.

12. A method of processing a silicon solar cell substrate, comprising the steps of sculpting the solar cell light receiving surface by scribing the light receiving surface of the substrate to form therein a plurality of recesses and subsequently chemically etching the scribed surface to give a plurality of discreet upstanding structures of specifically desired shape over substantially the entire surface of the substrate, the shape of each of the structures being a predetermined shape whose form does not depend on crystal planes of the silicon substrate, the predetermined shape being such as to substantially maximize anti-reflection properties and predominantly cause light transmitted into the silicon to be focused or steered so as to cause it to be multiply totally internally reflected from the silicon light receiving surface prior to reaching the opposite surface of the cell, and diffusing a dopant into the light receiving surface to form a p-n semiconductor junction.

13. The method of claim 12, wherein the processing is such as to give dimensions for the structures and the spacing between the structures which are comparable with the minority carrier diffusion length of the substrate material to minimize the path length of light within the silicon and within a diffusion length of the p-n junction formed in close proximity to the sculpted surface, thereby maximizing carrier collection probability.

14. The method of claim 13, wherein the minority carrier diffusion length is the expected end of life diffusion length, thereby maximizing carrier collection probabilities over the lifetime of the solar cell.

15. The method of claim 12, wherein a cross hatched pattern is formed by scribing and wherein the chemical etch conditions are chosen to give depletion at the bases of the recesses to produce a plurality upstanding pyramid structures such that the sides of the pyramids in the structure are at 16. The method of claim 12, wherein a cross hatched pattern is formed by scribing and the subsequent chemical etch conditions are chosen so as to accelerate the etching reaction proximate to the front surface of the substrate as compared with that progressively deeper in the recesses, thereby providing a plurality of adjacent upstanding finger-like structures having contoured walls, the angle of the walls with respect to the original flat surface of the substrate progressively increasing towards the base of the recesses.

17. The method of claim 16, wherein the chemical etch coditions are chosen so that the contoured walls all have angles of at least 60°.

18. The method of claim 12, wherein the step of scribing is performed with a laser to scribe a cross hatched pattern of grooves on the front surface of the substrate, the grooves being angles such that pairs of parallel grooves are angled away from each other into the substrate, and wherein the step of chemical etching is applied to remove the substrate between the opposed grooves, thereby providing a plurality of upstanding inverted substantially pyramidal shaped structures.

* * * * *

UNITED STATES PATENT AND TRADEMARK OFFICE
CERTIFICATE OF CORRECTION

PATENT NO. : 5,081,049
DATED : January 14, 1992
INVENTOR(S) : M. A. Green; S. R. Wenham; N. Srinivasamohan It is certified that error appears in the above-identified patent and that said Letters Patent is hereby corrected as shown below:

Column 1, line 31, change "change" to -- chance --.

Column 3, line 1, change "structure" to -- structures --.
Column 3, lines 42,43, change "improvement" to
   -- improvements --.

Column 6, line 41, change "virtrually" to -- virtually --.
Column 6, line 65, change "diffusino" to -- diffusion --.

Column 7, line 24, change "internal, reflections" to
   -- internal reflections --.
Column 7, line 26, change "interconnectins" to
   -- interconnecting --.
Column 7, line 3 , change "spacing" to -- spacings --.

Column 7, line 41, change "We claims." to -- THE CLAIMS
   DEFINING THE INVENTION ARE AS FOLLOWS: --.

Column 7, line 57, change "surfaca" to -- surface --.

Column 7, line 64, change "miximize" to -- maximize --.

Column 8, line 6, change "chosem" to -- chosen --.
Column 8, line 45, change "claim 1" to -- claim 8 --.

UNITED STATES PATENT AND TRADEMARK OFFICE
CERTIFICATE OF CORRECTION

PATENT NO. : 5,081,049

DATED : January 14, 1992

INVENTOR(S) : M. A. Green; S. R. Wenham; N. Srinivasamohan

It is certified that error appears in the above-identified patent and that said Letters Patent is hereby corrected as shown below:

Column 9, line 16, after "structure are at" insert -- an angle of at least 60° with respect to the original flat surface of the substrate. --.

Column 9, line 20, before "surface" delete "front".

Column 10, line 8, change "coditions" to -- conditions --.

Signed and Sealed this

Seventh Day of September, 1993

Attest:

BRUCE LEHMAN

Attesting Officer

Commissioner of Patents and Trademarks